United States Patent
Pantelic et al.

(10) Patent No.: US 12,106,932 B2
(45) Date of Patent: Oct. 1, 2024

(54) ELECTRON DETECTOR

(71) Applicant: DECTRIS AG, Baden-Dättwil (CH)

(72) Inventors: Radosav Pantelic, Baden-Dättwil (CH); Vittorio Boccone, Baden-Dättwil (CH)

(73) Assignee: DECTRIS AG, Baden-Dattwil (CH)

( * ) Notice: Subject to any disclaimer, the term of this patent is extended or adjusted under 35 U.S.C. 154(b) by 346 days.

(21) Appl. No.: 17/617,624

(22) PCT Filed: Jun. 13, 2019

(86) PCT No.: PCT/EP2019/065616
§ 371 (c)(1),
(2) Date: Dec. 9, 2021

(87) PCT Pub. No.: WO2020/249221
PCT Pub. Date: Dec. 17, 2020

(65) Prior Publication Data
US 2022/0238301 A1   Jul. 28, 2022

(51) Int. Cl.
*H01J 37/26* (2006.01)
(52) U.S. Cl.
CPC ....... *H01J 37/261* (2013.01); *H01J 2237/026* (2013.01); *H01J 2237/2802* (2013.01)
(58) Field of Classification Search
CPC ............... H01J 37/261; H01J 2237/026; H01J 2237/2802; H01J 2237/0203; H01J 2237/2441; H01J 2237/24455; H01J 2237/2446; H01J 2237/26; H01J 37/244
See application file for complete search history.

(56) References Cited

U.S. PATENT DOCUMENTS

| | | | | |
|---|---|---|---|---|
| 4,405,861 A * | 9/1983 | Giacchetti | ............. | H01J 37/244 250/397 |
| 4,555,626 A * | 11/1985 | Suzuki | ...................... | H05K 9/00 250/352 |
| 6,794,654 B1 | 9/2004 | Hanson et al. | | |
| 6,958,474 B2 | 10/2005 | Laprade et al. | | |
| 7,112,799 B2 * | 9/2006 | Vogtmeier | ............ | G01T 1/2019 250/370.11 |
| 8,729,471 B2 * | 5/2014 | Barbi | .................. | G01T 1/20188 250/306 |
| 9,341,585 B2 * | 5/2016 | Barbi | .................. | G01T 1/20185 |

(Continued)

OTHER PUBLICATIONS

Faruqi et al: "A tiled CCD detector with 2×2 array and tapered fibre optics for electron microscopy", Nuclear Instruments & Methods in Physics Research. Section A, Elsevier BV * North-Holland, NL, vol. 477, No. 1-3, Jan. 21, 2002, pp. 137-142.

(Continued)

*Primary Examiner* — David A Vanore
(74) *Attorney, Agent, or Firm* — Renner, Otto, Boisselle & Sklar, LLP

(57) ABSTRACT

An electron detector comprises a sensor module comprising a sensor for detecting electrons, and an electronics module comprising circuitry for processing signals received from the sensor module. Wiring is provided for electrically connecting the sensor module to the electronics module. An adaptor is arranged between the sensor module and the electronics module. The adaptor comprises a passage for the wiring, and shielding elements for shielding from radiation.

20 Claims, 11 Drawing Sheets

(56) References Cited

U.S. PATENT DOCUMENTS

| | | | | |
|---|---|---|---|---|
| 9,482,562 | B2* | 11/2016 | Hefetz | G01T 1/20 |
| 2004/0065839 | A1* | 4/2004 | Elgali | G01T 1/2985 |
| | | | | 250/370.11 |
| 2006/0163478 | A1* | 7/2006 | Jaksch | H01J 37/244 |
| | | | | 250/310 |
| 2012/0025074 | A1* | 2/2012 | Barbi | G01T 1/20188 |
| | | | | 250/361 R |
| 2014/0042316 | A1* | 2/2014 | Barbi | H01J 37/244 |
| | | | | 250/307 |
| 2014/0124667 | A1* | 5/2014 | Tsao | H01J 37/244 |
| | | | | 361/818 |
| 2020/0018639 | A1* | 1/2020 | Chen | G01J 1/0437 |
| 2020/0402760 | A1* | 12/2020 | Van Der Mast | H01J 37/185 |
| 2022/0238301 | A1* | 7/2022 | Pantelic | H01J 37/261 |

OTHER PUBLICATIONS

McMullan et al: "Electron imaging with Medipix2 hybrid pixel detector", Ultramicroscopy, Elsevier, Amsterdam, NL, vol. 107, No. 4-5, Jan. 25, 2007 (Jan. 25, 2007), pp. 401-413.

International Search Report for corresponding International Patent Application No. PCT/EP2019/065616 dated Apr. 7, 2020.

Written Opinion for corresponding International Patent Application No. PCT/EP2019/065616 dated Apr. 7, 2020.

A.R. Faruqi et al.; Pixel detectors for high-resolution cryo-electron microscopy; Elsevier; Nuclear Instruments and Methods in Physics Research A 549; 2005; 192-198.

A.R. Faruqi et al.; Electronic detectors for electron microscopy; ResearchGate; Quarterly Reviews of Biophysics; Apr. 2011.

* cited by examiner

ELECTRON DETECTOR

This application is a national phase of International Application No. PCT/EP2019/065616 filed 13 Jun. 2019, the entire disclosure of which is hereby incorporated by reference.

TECHNICAL FIELD

The present invention relates to an electron detector.

BACKGROUND ART

Advancements in electron optics and automation are among the key factors that have enabled Transmission Electron Microscopy (TEM) to achieve near-atomic and sub-atomic resolution in structural biology and materials science, respectively. However, the most demanding applications are always pushing technology to advance further. While electron sources are brighter and electromagnetic lenses are more stable, aberration corrected detectors remain an area for improvement.

Hybrid pixel sensors are known for photon detection. However hybrid pixel sensors may also be used for electron counting, see "Electronic detectors for electron microscopy", A. R. Faruqi and R. Henderson, Quarterly Review Biophysics, 2011 August, 44(3): 357-90.

DISCLOSURE OF THE INVENTION

It is a general object of the invention to provide a detector applicable for electron microscopy.

The electron detector according to the present invention comprises a sensor module comprising a sensor for detecting electrons, and an electronics module comprising circuitry for processing signals received from the sensor module. Wiring electrically connects the sensor module to the electronics module. An adaptor is arranged between the sensor module and the electronics module. The adaptor comprises a passage for the wiring, and shielding elements for shielding radiation.

By using the adaptor as proposed, a detector can be built that may use many components used in non-electron detector applications, such as in photon detection. The set-up of the present electron detector allows multiple components of a different detector detecting or counting photons to be re-used or manufactured as multi-use components for either variety or type of detector.

The sensor for detecting electrons preferably is a sensor applicable in electron microscopy applications, and preferably in transmission electron microscopy (TEM) applications or scanning TEM applications. Accordingly, in one embodiment, the electron detector may be arranged in combination with an electron source, electron optics and a vacuum system.

In one embodiment, the sensor for detecting electrons is a semiconductor-based sensor that relies on semiconductor materials, such as silicon, or high-Z, materials such as CdTe, GaAs, Diamond, Ge or CdZnTe to measure the effect of incident electrons. In such a semiconductor-based sensor, the semiconductor detection material is typically arranged between two electrodes. Incident electrons may be directly sensed without conversion to photons, typically via charge carriers released by the impinging electron. In a preferred embodiment of a semiconductor electron sensor, the sensor is a hybrid pixel sensor comprising a sensor and a readout chip, where the sensor electrodes are patterned such as to match a pixelated array of readout electronics connected via an array of contacts (e.g., bump bonds). Different technologies may be used for the semiconductor sensor and the readout chips, allowing separate optimizations. The sensor may be used in diffraction as well as in imaging mode.

Given that e.g. a semiconductor-based sensor such as a hybrid pixel sensor may also be used in a different application such as radiation detection, in particular x-ray detection, it is desired to make such sensor, once developed, a multi-use sensor also usable in an electron detector for electron sensing. While for both, radiation sensing and electron sensing, the detector not only comprises the sensor but also further electronics, mechanics etc. it is desired to make also these components once developed multi-use components or redesign with only little amendments or adaptations, in particular when it comes to the design and mechanical functionality of the components.

Sensing in electron microscopy requires a vacuum for the sensor to be arranged in given that electrons are least scattered in vacuum. In addition, the electronics module is desired to be located outside the vacuum in order to improve vacuum conditions by preventing outgassing from the electronics module contaminating the vacuum.

On the other hand, electron beams as primary radiation may generate secondary radiation such as x-rays or lower energy electrons which is desired to be blocked from irradiating a user and/or from impacting the electronics module. Euratom safety requirements are desired to be met.

Hence, electron detection specific elements are preferably embodied in the adaptor, and/or can be assembled to the adaptor. Of course, other components such as the electronics module may include different functionality in electron sensing compared to photon sensing. However, such different functionality may manifest in different logic or software or electrical components on a printed circuit board, which not necessarily may require a change in the design of the component. In particular the footprint and/or dimensions e.g. of the electronics module and/or other electronics, an optional housing of the detector, and/or other mechanical components may remain the same as for other kinds of detectors. As a result, various detectors detecting different parameters, such as radiation versus electrons, can be manufactured in a modular way including multi-use components that may be applied in different detectors.

The adaptor not only is arranged between the sensor module and the electronics modules, but preferably also mechanically connects the sensor module and the electronics module. Hence, the adaptor supports the sensor module. For this reason, the adaptor preferably comprises a support portion, while the sensor module preferably comprises a support for the actual sensor, such that the support portion of the adaptor and the support of the sensor module are mechanically linked, e.g. by means of gluing, screwing, or other means. The same may be true for the electronics module and the adaptor. The adaptor may support the electronics module. For this purpose, the adaptor may comprise a mechanical interface such as a nose-piece coupled to a platform of the electronics module, by means of gluing, screwing, or other coupling means. Preferably, the electronics module comprises circuitry preferably arranged on a printed circuit board, including but not limited to Integrated Circuits (ICs), capacitors or resistors. In one example, the platform has the shape of a frame and two printed circuit boards supporting the circuitry are mounted on different sides of the platform. In a different embodiment, the platform supporting the circuitry may be formed integral with the adaptor.

The electronics module may preferably take the form of a plate with a main extension in a horizontal plane, and a rather low thickness. In one example, the sensor module may show a main extension in a vertical plane, i.e. orthogonal to the extension of the electronics module.

A combination of the electronics module, the adaptor and the sensor module is also referred to as unit. Such unit may be pre-assembled from an individual sensor module, an electronics module and an adaptor, which unit may be introduced in a housing or chassis of the electron detector, e.g. by sliding. For this purpose, the electronics module, in particular its platform, may contain guides that co-operate with rails or other guides at the inner surface of the housing.

Wiring is provided for electrically connecting the sensor module to the electronics module. Preferably, the wiring is supported by a flexible carrier, such as a flexible printed circuit board which may additionally support additional components such as ICs in one embodiment. In a different embodiment, the wiring is embodied as one of a ribbon cable, a flexible flat cable, a flat connector or a similar connection.

The adaptor shows a first mechanical interface for mechanically connecting to the electronics module, e.g. in form of a nose piece, and a second mechanical interface for connecting to the sensor module. However, given that a body of the adaptor extends between the electronics module and the sensor module, a certain path needs to be overcome by the wiring when connecting the sensor module to the electronics module. And, the wiring needs to overcome a sealing portion of the adaptor, which will be introduced in more detail later. For this reason, the adaptor has one or more passages for the wiring to reach through from its way from the sensor module to the electronics module. Such passage may in a first embodiment be represented as a through-hole in the body of the adaptor, and specifically in the sealing portion. In a different embodiment, the passage may rather be a recess in the body of the adaptor, which recess is open in one direction.

In one embodiment of the invention, the adaptor comprises a beam portion between the sealing portion and the support portion. The beam portion preferably shows a cross section smaller than a cross section of the sealing portion, and the wiring or its carrier may be deposited on a surface of the beam portion, e.g. by gluing. Given that in such scenario the sealing portion exceeds the beam portion in height, it is preferred that the one or more passages are arranged in the sealing portion such that a bottom of the passages is co-planar with e.g. a top surface of the beam portion, and/or is co-planar with the printed circuit board/s of the electronics module. In such embodiment, the wiring and its carrier/s may pass the passage without being bent too much. An offset of up to +/−0.5 mm between the bottom of the passage and the top of the beam portion and/or the circuitry may be acceptable in one embodiment. The wiring may be soldered to the circuitry of the electronics module, or be connected thereto by means of a connector, and be soldered to the sensor or circuitry connected upstream to the sensor, or be connected thereto by means of a connector.

The sealing portion of the adaptor preferably has a main planar extension orthogonal to the main extension of the electronics module. This results from the sealing portion being responsible for, preferably together with other components such as the sealing plate introduced below, sealing one or more openings of the housing through which the one or more units are inserted and extend into the housing. Hence, the sealing portion of the adaptor preferably comprises a mechanical interface facing the housing when being mounted in/to the housing. This interface preferably includes a recess for an O-ring seal, or for any other sealing means, and/or preferably includes means for mounting the sealing portion to a flange of the housing, and/or to a sealing plate.

Given that the sensor module is configured to detect electrons, the sensor module preferably is operated in vacuum conditions. Hence, a domain of the sensor module, i.e. the space around the sensor module preferably is under vacuum, at least when the detector is operated. In order to provide a space that can be evacuated, components of the detector, such as the flange to be introduced later on, and components outside the detector, such as an electron source of an electron microscope may contribute to encapsulating this space also referred to as sensor module domain. Instead, an inside of the housing of the detector does not need to be operated under vacuum. For this reason, a vacuum in the sensor module domain is to be sealed from the electronics module, i.e. the inside of the housing of the detector, also referred to as electronics module domain. Hence, an opening in the housing preferably is vacuum sealed versus the sensor module domain. The vacuum seal may in one embodiment comprise a separate sealing plate to be mounted to the housing, e.g. to a flange of the housing surrounding the opening in the housing. Such sealing plate preferably is made from a gas tight material, and is sealing mounted to the housing. The sealing plate preferably has one opening per unit for introducing the respective unit into the housing of the detector. The sealing portion of the adaptor in turn seals the opening in the sealing plate. For this purpose, the adaptor seals the opening e.g. by means of a sealing ring attached to the interface of the sealing portion of the adaptor. Hence, the sealing portion of the adaptor, preferably in combination with the sealing plate, separates the sensor module domain from the electronics modules domain.

Preferably, the or each passage in the adaptor is sealed by means of a sealing compound, preferably an epoxy. The sealing compound, however, may be applied prior to the unit entering the housing, however, after having mounted the wiring. The sealing compound is gas tight, such that no gas may enter the sensor module domain from the non-vacuum electronics module domain.

The adaptor preferably comprises shielding elements for supporting shielding. Preferably, secondary radiation, and in particular x-rays present in the sensor module domain, shall remain confined therein in order not to expose a user and guarantee the safety of the user. On the other hand, it may also be beneficial to shield the electronics module from radiation present in the sensor module domain. "Supporting shielding" may express that additional means, such as a shielding plate to be introduced later on, may in combination with the adaptor provide for the shielding. "Shielding" may not only include a full barrier as to the radiation in question, but also includes lowering the transmitted radiation to allowed, certified levels. In the sensor module domain x-ray radiation may be effected during measurements in response to bremsstrahlung generated by the electrons.

Given that the adaptor may be of a material to absorb primary or secondary radiation, a certain path length is required in such material which would lead to an adaptor with extended dimensions. For this reason, shielding elements are introduced into the body of the adaptor, which shielding means decreased a range for primary or secondary radiation entering from the sensor module domain. The shielding elements are preferably highly absorbing to primary or secondary radiation and are preferably made from one of tungsten, lead, tantalum, molybdenum. In a different embodiment these materials may be comprised in the shielding element together with other materials. In one example, Inermet® may be used which is a tungsten, copper zinc alloy. In view of effort and costs, it is not envisaged to manufacture the entire body of the adaptor or the shielding portion from the primary or secondary radiation absorbing material, but only individual shielding elements that are arranged in the sealing portion. While the shielding elements generally may take any shape, it is preferred that the shielding elements are prefabricated inserts that are inserted in holes drilled in the body. Preferably, the inserts show a straight, longitudinal extension, preferably with a circular cross section.

With the intent to reduce the path for primary or secondary radiation in the body of the adaptor and at the same time keeping a width of the sealing portion of the adaptor small, the inserts are preferably arranged at different positions along a width of the sealing portion. Preferably, the width of the sealing portion is less than 3 cm.

In order to further reduce the generation of regular structures which might cause the formation of radiation leakage paths and hence enhance the absorption of the primary or secondary radiation in the material of the body, the rods preferably show two or more different diameters: E.g., a first and a second one, the first one exceeding the second one. By such means, the rods can be arranged close to each other, in particular rods of different diameters at different width positions of the sealing plate, thereby improving the shielding. In addition, the thickness of the sealing portion of the adaptor may be minimized. Preferably, the rods are arranged in the sealing portion such that no line of sight is allowed through the sealing portion. Preferably, the rods support absorbing the primary or secondary radiation.

Given that the sealing portion of the adaptor is penetrated by the one or more passages, at least one, and preferably more of the inserts extend into the passage, and preferably bridge the passage. This is preferred since outside the body of the sealing portion, i.e. in the one or more passages, the primary or secondary radiation needs to be shielded as inside the body. In such embodiment, the wiring may pass through the passage between two or more of the inserts or between an insert and a wall defining the passage. In such arrangement of the wiring, its carrier is preferred to be flexible. Preferably, the carrier is S-shaped when meandering the rods in the passage. The rods exposed in the passage may prevent the sealing compound from escaping.

Accordingly, the adaptor, and in particular the sealing portion of the adaptor not only contributes to a vacuum seal but also supports for absorbing additional primary or secondary radiation where secondary radiation is generated in the vacuum sensor module domain during electron interaction. The latter may also be achieved in combination with one or more shielding plates arranged in the sensor module domain. For example, a shielding plate may be arranged in the sensor module domain between the sealing portion of the adaptor, and its support portion. Accordingly, the shielding plate comprises an opening for the adaptor to reach through and preferably an opening per adaptor, and in particular for the beam portion of each adaptor to reach through.

In an embodiment, a flange is integrated in the sealing plate, for attaching the detector to other components, such as an electron source co-defining the vacuum sensor module domain may be attached to the flange. A shield may be inserted into the sealing plate to support shielding in combination with the sealing portion of the adaptor and the shielding plate. The shield and the shielding plate if any are preferably strongly absorbing primary or secondary radiation and are preferably made from one of tungsten, lead, tantalum, molybdenum. In a different embodiment these materials may be comprised in the shielding element together with another material. E.g. Inermet® may be used.

In another embodiment, the shielding elements such as the rods may also comprise borated alloys to shield neutron radiation in further applications.

A third function of the adaptor preferably is cooling. Heat generated by the sensor module or in the sensor module domain, or in the electronics module or the electronics module domain may be transferred via the adaptor to the housing of the electron detector, or to the platform of the electronics module. For this reason, it is preferred that the adaptor is made from or comprises a thermally conducting material, such as metal. In addition, the platform of the electronics modules preferably is made from or comprises a thermally conducting material, such as metal, as well as the support of the sensor module.

The number of units per detector is not limited to one. Instead, any other number of units may be arranged in the common housing. The housing preferably comprises individual openings per unit in a common face of the housing. In a preferred embodiment, the sensor module, and possibly also the adaptor are shaped such that another sensor module with adaptor can be arranged on each of its sides in order to build a larger sensor array out of individual unit. For this purpose, it is preferred that the sensor module and at least the sealing plate of the adaptor are of rectangular cross section, such that they abut when being arranged next to each other to contribute to a large sensor array.

After the units being mounted to the housing all the electronics modules are arranged inside the housing, while all the sensor modules are located outside, and preferably are arranged in a common sensor module domain. In case of a single sealing plate provided for all units, the sealing plate preferably comprises one opening per adaptor. In such manner, the individual units may easily be inserted into the assigned opening and be mounted to the sealing plate. The assembly including the units mounted to the sealing plate may then be mounted to the housing of the detector. Also in case of one or more shielding plates, it is preferred that each shielding plate is a single shielding plate shielding all the electronic modules, and each shielding plate preferably comprises one opening per adaptor.

According to another aspect of the present invention, an adaptor is provided with a first mechanical interface for connecting to a sensor module comprising a sensor for detecting electrons, and a second mechanical interface for connecting to an electronics module comprising circuitry for processing signals received from the sensor module. Shielding elements are configured to shield a domain determined by the second mechanical interface from radiation incident from a domain defined by the first mechanical interface. A passage is provided and configured to allow wiring for electrically connecting the sensor module to the electronics module to pass the adaptor.

All of the above embodiments of the electron detector shall also be disclosed in connection with the bare adaptor claimed in this aspect of the present invention.

According to another aspect of the invention, a detector including shielding and sealing means between the sensor module domain and the electronics module domain, and including an adaptor between the sensor module and the electronics module, may also be used for one of:
x-ray detection;
gamma radiation shielding;
neutron detection;

neutron secondary radiation protection;
proton detection, alpha detection.

According sensors sensitive to the kind of radiation to be detected are used in the corresponding sensor module instead of the electron sensor used in the electron detector according to the previous aspects of the present invention, and the shielding materials are replaced by materials absorbing the corresponding primary or secondary radiation. All other components may remain as is described in connection with electron detection.

BRIEF DESCRIPTION OF THE DRAWINGS

The invention will be better understood and objects other than those set forth above will become apparent when consideration is given to the following detailed description thereof. This description makes reference to the annexed drawings, wherein the figures show.

MODES FOR CARRYING OUT THE INVENTION

Figure 1:
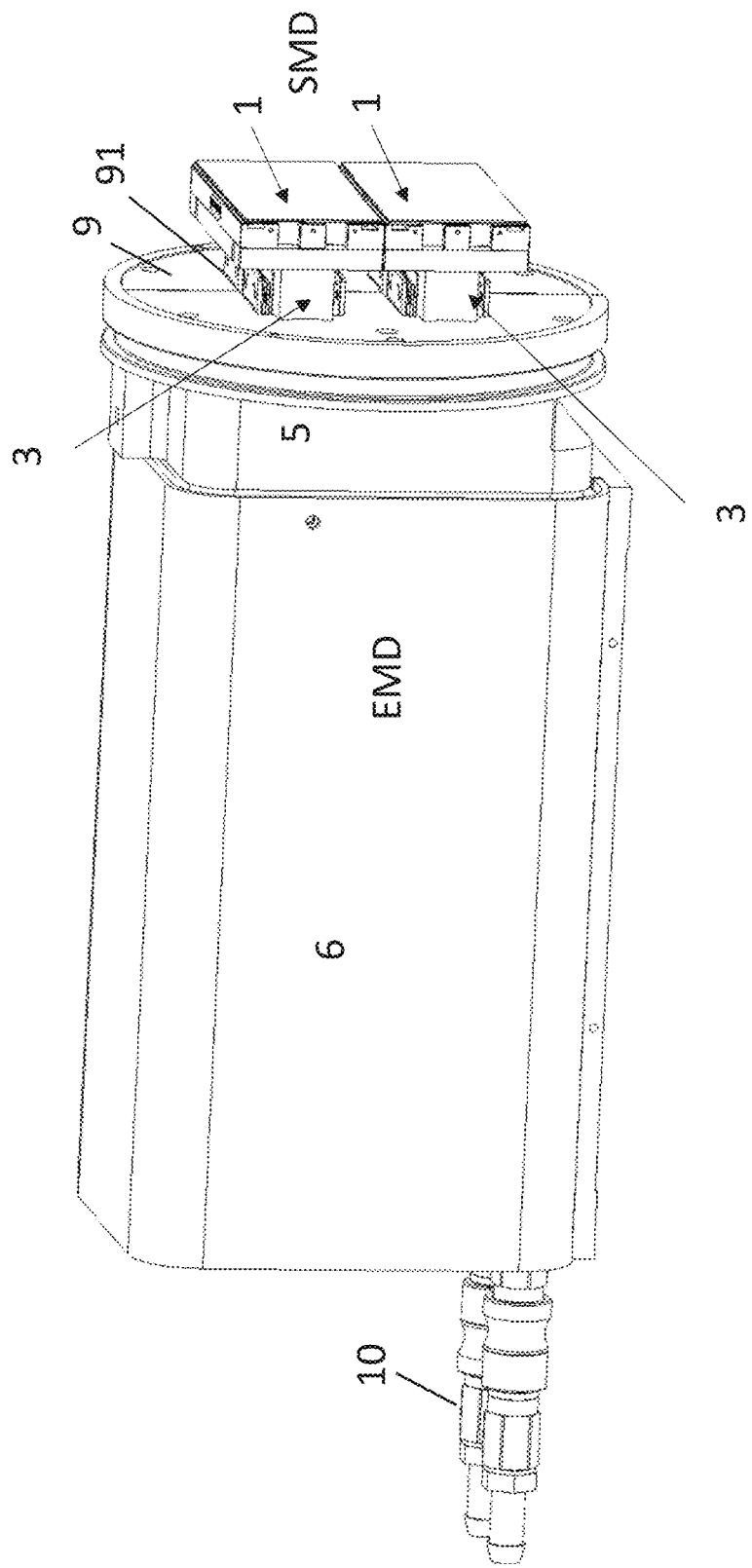
FIG. 1 an electron detector according to an embodiment of the invention, in a perspective side view, FIG. 2 the electron detector of FIG. 1 in an exploded view, FIG. 3 a unit of an electron detector according an embodiment of the present invention, in a first perspective view, FIG. 4 the unit of FIG. 3 in a second perspective view, FIG. 5 the unit of FIG. 3 in a third perspective view, FIG. 6 the unit of FIG. 3 in a perspective open cut view, FIG. 7 an electron detector according to an embodiment of the invention, in a perspective exploded view, FIG. 8 an electron detector according to an embodiment of the invention, in a perspective exploded view, FIG. 9 an electron detector according to an embodiment of the invention, in a perspective exploded view, FIG. 10 the electron detector of FIG. 1 or FIG. 8 in a perspective side view, FIG. 11 an electron detector according to an embodiment of the invention, in a perspective open cut view.

FIG. 1 shows a perspective side view of an electron detector according to an embodiment of the invention. The electron detector comprises a housing 6 and one or more connectors 10 for supplying the detector with power and/or for data transmission. One of the front ends of the housing 6 is covered by a vacuum sealing plate 5. A shielding plate 9 is attached to the sealing plate 5.

Two units are arranged to a large extent inside the housing 6. Each unit comprises a sensor module 1 visible in FIG. 1 and reaches through an opening 91 in the shielding plate 9 and through an opening in the sealing plate 5 (not visible). Next to the sensor module 1 each unit comprises an adaptor 3 mechanically and elects connecting the sensor module 1 to an electronics module (not visible) arranged inside the housing 6.

The sensor modules 1 are configured to detect electrons. Hence, the detector is an electron detector such as used in electron microscopy applications. Given that electrons approaching the sensor modules 1 may generate secondary radiation, it is desired to prevent such radiation from escaping from a sensor module domain SMD and hence to prevent a user of the detector from being exposed to the radiation, and preferably to shield the electronics modules in the housing 6 from such radiation. The shielding plate 9 is arranged and configured to contribute to such shielding function. The shielding plate 9 is arranged in the sensor module domain SMD. In contrast, a domain inside the housing 6 is also referred to as electronics module domain EMD. As to the material, it is preferred that the shielding plate 9 comprises or consists of an x-ray and electron shielding material, such as tungsten.

In addition, for the sensor module 1 to properly work it is preferably arranged in a vacuum. Hence, the electron detector as shown in FIG. 1 may be mounted, e.g. by means of a flange comprised in the sealing plate 5, to an electron source. The resulting confined space is evacuated, such that the sensor module domain SMD is under vacuum at least during operation of the electron detector. On the other hand, the inside of the housing 6 of the electron detector is not required to be evacuated, but typically is operated under atmospheric conditions. For this reason, the electron detector comprises a vacuum seal for separating the vacuum sensor module domain SMD from the non-vacuum electronics module domain EMD. The sealing plate 5 contributes to such vacuum seal and acts as a vacuum barrier. The sealing plate 5 is preferably mounted to the housing 6. The units are preferably mounted to the sealing plate 5.

Figure 2:
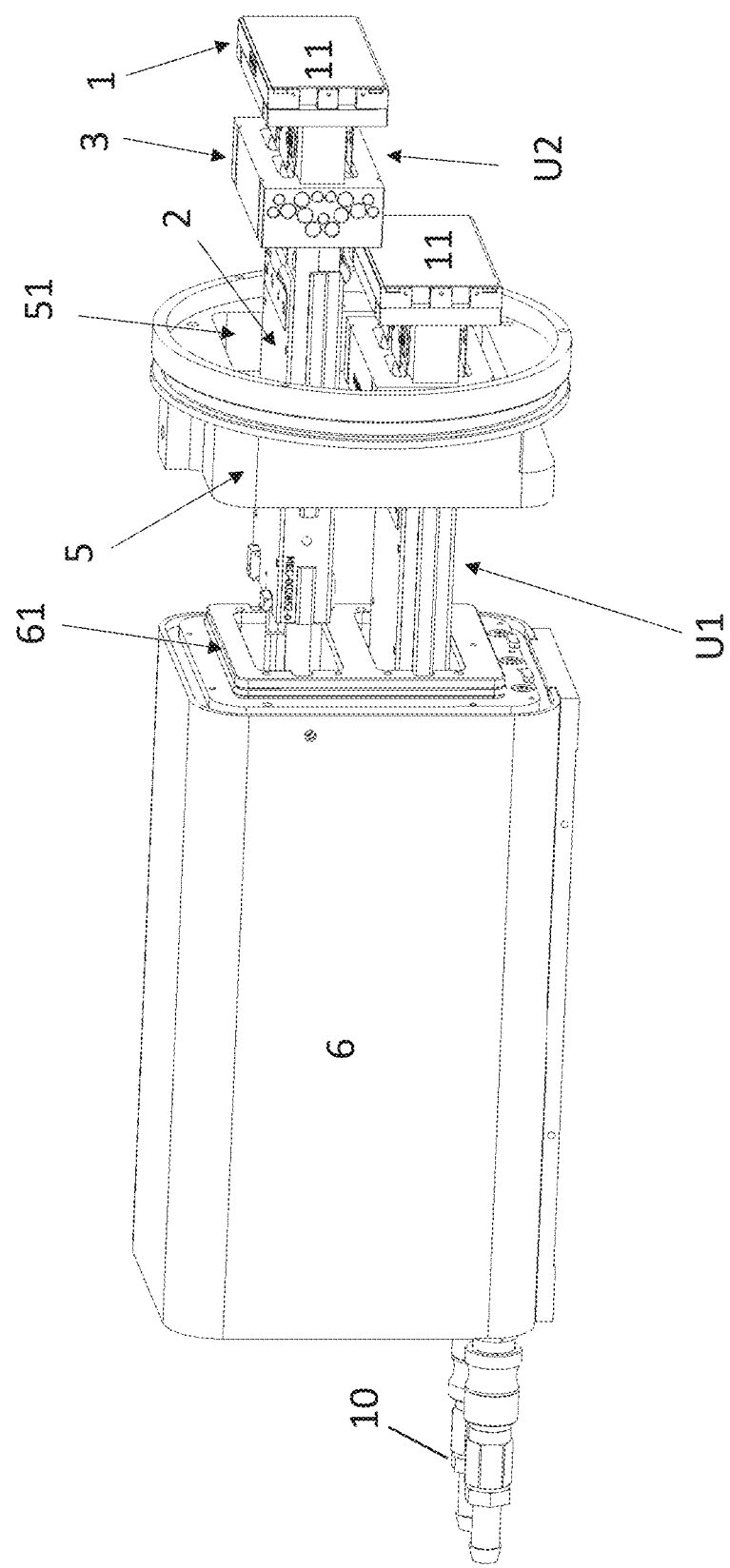

FIG. 2 illustrates the electron detector of FIG. 1 in an exploded view. The sealing plate 5 is drawn from the housing 6 which renders the two units U1 and U2 inserted in the housing 6 visible. For illustration purposes, the lower unit U1 is drawn from the housing 6 to a lesser extent than the upper unit U2. Each unit U1, U2 comprises the sensor module 1 and an electronics module 2. An adaptor 3 mechanically and electrically connects the sensor module 1 to the respective electronics module 2. Each unit U1, U2 is inserted into a dedicated opening 51 in the sealing plate 5, and is mounted to the sealing plate 5. This assembly comprising the modules U1 and U2 and the sealing plate 5 is then mounted to a flange 61 of the housing 6.

Figure 3:
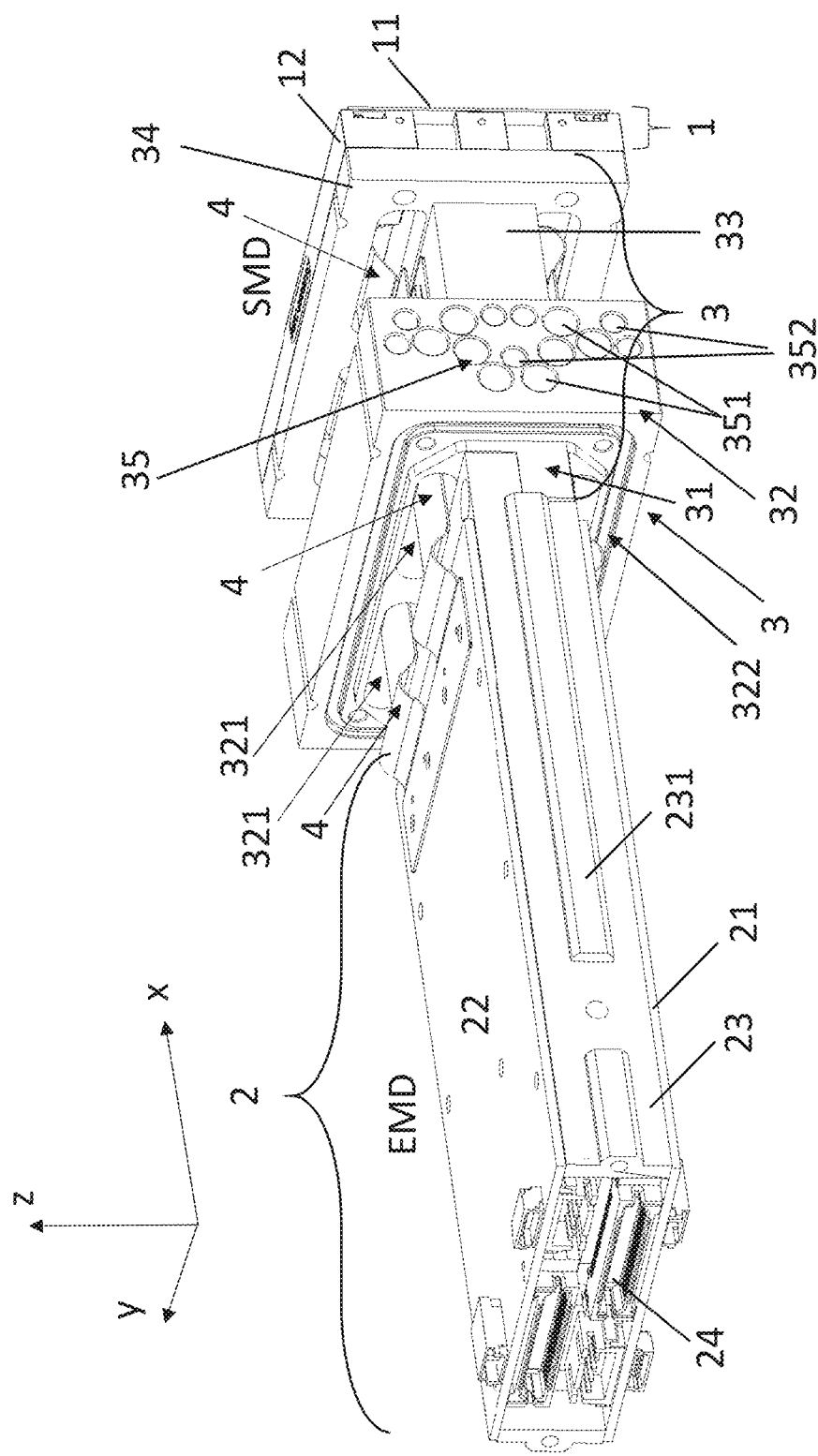

FIG. 3 illustrates a unit of an electron detector according to an embodiment of the present invention, in a first perspective view. Such unit may be, for example, one of the units U1 or U2 as shown in FIG. 2.

The unit comprises a sensor module 1 connected to an electronics module 2 via an adaptor 3. The electronics module 2 presently comprises a platform 23, e.g. in the form of a frame, which platform 23 presently supports two printed circuit boards 21 and 22. Given that the printed circuit boards 21 and 22 each carry electrical and/or electronics collectively referred to as circuitry, reference numerals 21 and 22 are also used to denote circuitry of the electronics module 2 in general. A back end of the electronics module 2 carries sockets and/or other electrical connectors 24, e.g. for connecting to further circuits or wiring in the electron detector housing, and/or for receiving power supply e.g. via the connector/s 10, see FIG. 1.

The platform 23 of the electronics module 2 is attached to the adaptor 3, e.g. to a nose-piece 31 of the adaptor 3, and hence mechanically connected, e.g. by welding, screwing, or gluing. The adaptor 3 further includes a sealing portion 32 resembling a box-like piece, and a beam portion 33 extending from the sealing portion 32. At the end of the beam portion 33 a support portion 34 is provided in form of a plate for attaching the sensor module 1 to. The sensor module 1 comprises a support 12 attached to the support portion 34 of the adaptor 3, and a sensor 11 attached to the support 12.

Accordingly, in the present embodiment, the unit comprises the electronics module 2 primarily extending in a horizontal plane x,y, and the sensor module 1 primarily extending in a plane orthogonal to the horizontal plane x,y, i.e. in a vertical plane y,z. However, the sensor module 1 may also be oriented in a different plane if needed. As to the adaptor 3, it is preferred that the shielding portion 32 of the adaptor 3 covers the opening in the housing 6 or the opening of a sealing plate to be introduced yet. Hence, it is preferred that a cross section of the sealing portion 32 matches or exceeds the opening in the housing 6 or the opening in the sealing plate. In addition, it is preferred that a cross section of the sealing portion 32 exceeds a cross section of the beam portion 33.

The adaptor 3, and in particular its sealing portion 32, includes a passage 321, and presently includes four passages 321, three of which are visible in FIG. 2. The passages 321 are provided for a wiring 4 which wiring 4 electrically connects the sensor module 1 with the electronics module 2. The wiring 4 presently is embodied on a flexible carrier, such as flexible printed circuit boards with or without components arranged on it. In a different embodiment, the wiring 4 is embodied as n ribbon cable or a similar connection.

As can be derived from FIG. 3, each of the passages 321 is built as a cut-out in the sealing plate 32 with a bottom of each cut-out being in the same plane as a top of the beam portion 33 and a top of the circuitry 21,22. In a different embodiment, a step between the bottom of the passage 321 and the top of the respective aligned component is at most+/−0.5 mm. This facilitates a feed-through of the wiring 4 and its respective carrier and an electrical contact to the circuitry 21,22 at the same level. In the present example, the wiring carriers are sealed and held in the passages 321, e.g. by a sealing compound, such as an epoxy. The sealing compound is configured to avoid gas, and in particular air to pass through the passages 321. Preferably, a width of the sealing portion 32 in x-direction is dimensioned dependent on the width of the rods arrangement (see below) in x-direction required for effective primary or secondary shielding, and dependent on the extension of the sealing compound in x-direction required for effective sealing.

On the end of the sensor module 1, it can be derived from FIG. 3 that the wiring 4 is fed through further passages in the support portion 34 of the adaptor 3 and connects to the sensor 11 or to other electronics resident in the sensor module 1.

The sealing portion 32 comprises shielding elements 35 in the form of rod-shaped inserts, only a diameter of which is visible in the perspective view of FIG. 3. As can be derived from FIG. 3, there are different types of rods 35 used: A first number 351 of rods with a first diameter, and a second number 352 of rods with a second diameter, the second diameter being less than the first diameter. The rods 35 are presently arranged in y-direction only, and all rods 35 are arranged in parallel to each other. The rods 35 reach through the entire body of the sealing section 32 in y-direction, from a side wall that is shown in FIG. 3 to an opposite side wall not visible in FIG. 3. The rods 35 are arranged in different planes in x-direction.

The rods 35 are arranged and configured to prevent or reduce an impact of primary or secondary radiation on the electronics module 2. In particular, in the application of electron microscopy electrons may generate x-ray-bremsstrahlung or lower energy electrons which may damage the electronics module 2. The rods 35 are made from a material that absorbs primary or secondary radiation. In combination with suitably dimensioning a width of the sealing portion 32 the rods 35 are arranged such that primary or secondary radiation incident from the sensor module domain SMD are absorbed and/or scattered which decreases the range of the radiation.

Accordingly, in the unit shown in FIG. 3 the adaptor 3, and in particular its sealing portion 32 separates a sensor module domain SMD from an electronics modules domain EMD, which two domains SMD and EMD operate under different conditions. The sensor module domain SMD is assumed as vacuum domain when operating the electron detector, while the electronics module domain EMD is assumed to operate under non-vacuum conditions. Hence, the sealing portion 32 of the adaptor 3 on the one hand contributes to a vacuum seal, i.e. the material of the body of the adaptor 3 preferably is gas tight. The one or more openings 321 arranged in the sealing portion 32 are preferably sealed by a seal which may be applied e.g. in liquid or viscous form and may be hardened. Hence, the adaptor 3, and in particular its sealing portion 32 not only shields the interior of the housing 6, and in particular the electronics module 2, from primary or secondary radiation, but also seals the vacuum sensor module domain SMD from the electronics module domain EMD.

Given that heat may be generated in the sensor module 1, it is preferred that the adaptor 3 supports a third function in addition to primary or secondary radiation shielding and vacuum sealing, i.e. heat dissipation. For this reason, it is preferred that the body of the adaptor 3 is made from a thermally conducting maters such as metal, as is preferably made the platform 23 of the electronics module 2, as is preferably made the support 34 portion of the sensor module 1. Given that all these components are mechanically and thermally connected, heat may be removed from the sensor module 1 via the adaptor 3 to the platform 23 of the electronics module 2 and dissipate there when acting as a heat sink, or may be further guided to a heat sink of the housing 6, for example.

Preferably, the platform 23 of the electronics module 2 comprises guides 231. The guides 231 may cooperate with e.g. rails on an inner surface of the housing 6 such that the unit shown in FIG. 3 can be slid into the housing.

A face of the sealing portion 32 of the adaptor 3 facing the electronics module 2 includes an interface 322. Preferably, and as will be explained later on, the adaptor 3 is attached by means of this interface 322 to a sealing plate. The interface 322 presently includes a recess for accepting e.g. an O-ring as seal.

Figure 4:
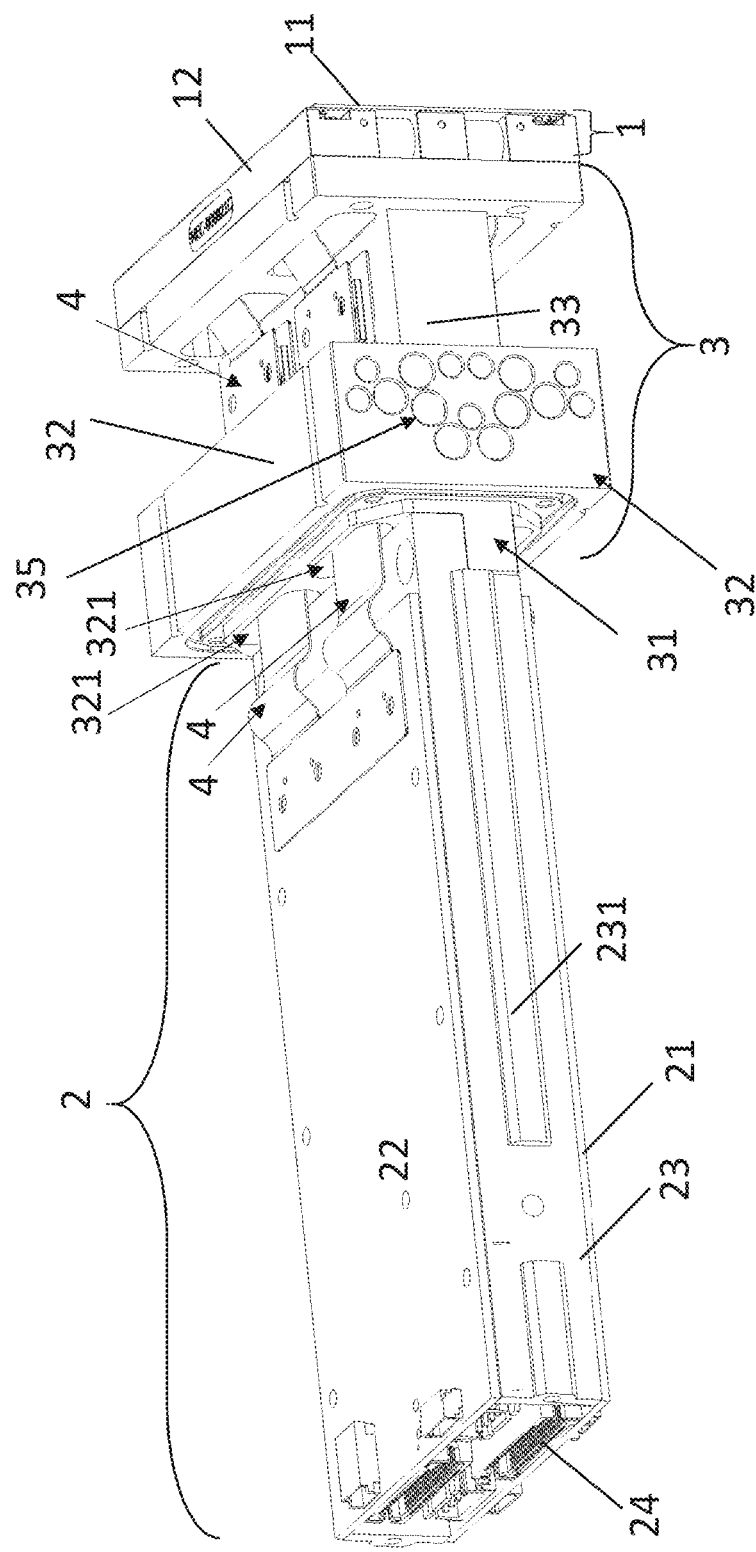
Figure 5:
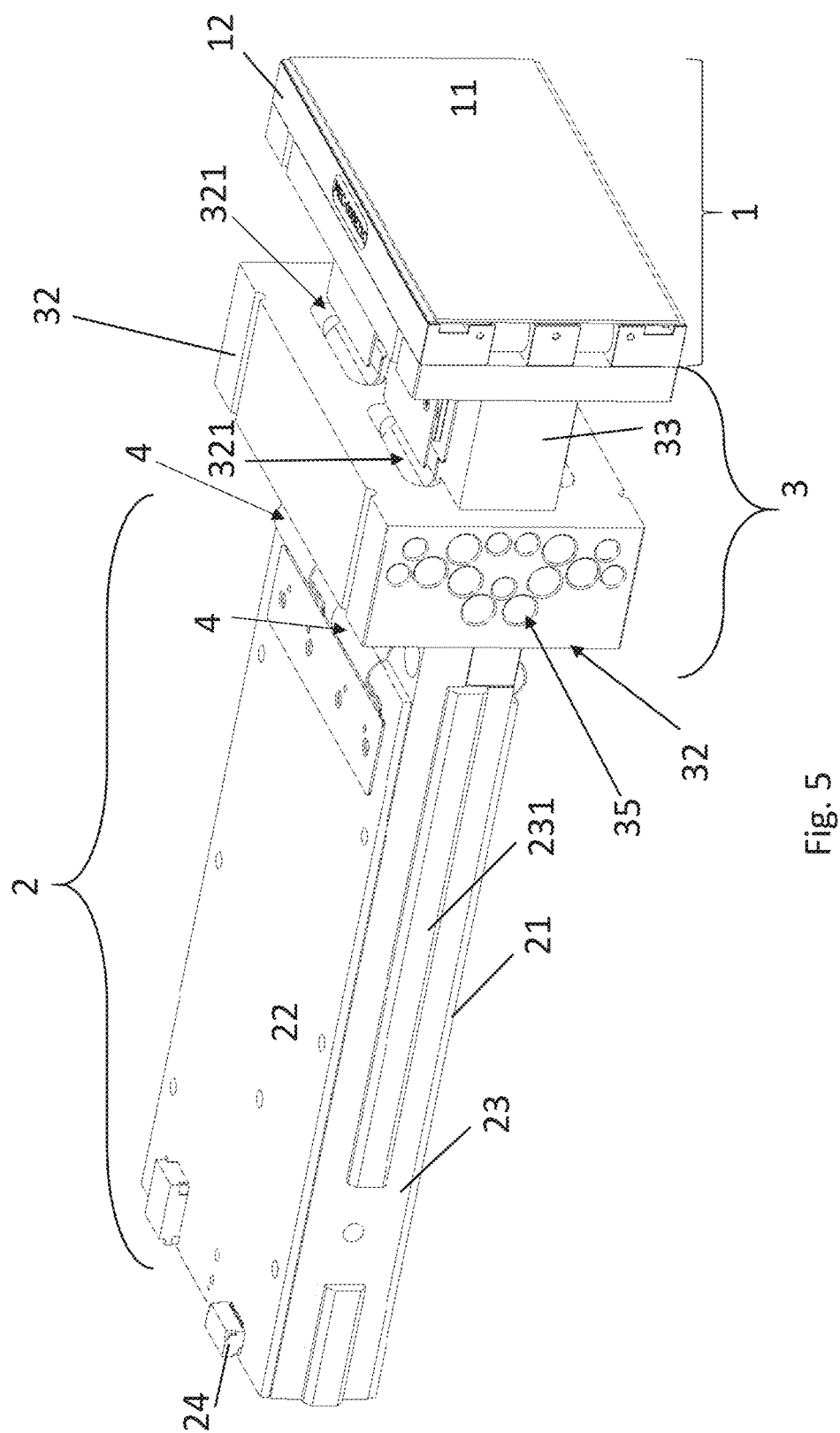

FIGS. 4 and 5 show the unit of FIG. 3 in different perspective views.

Figure 6:
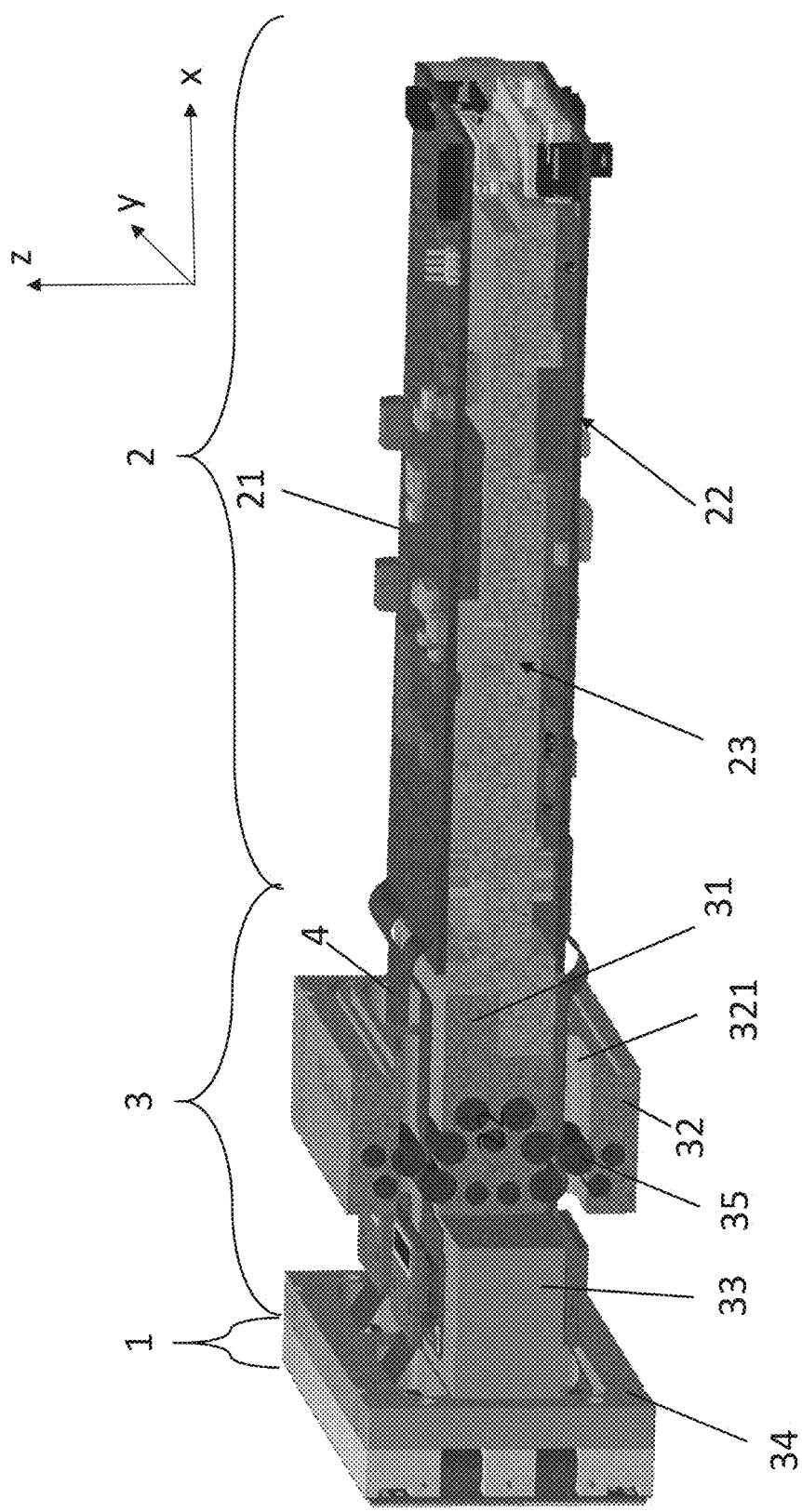

FIG. 6 illustrates the unit of FIG. 3 in a perspective open cut view. This view in particular illustrates the arrangement of the inserts 35 in the adaptor 3, and in particular in the sealing portion 32 of the adaptor 3. As can be derived from this open cut view, the inserts 35 also extend into the one or more passages 321, and in particular bridge the one or more passages 321. Accordingly, in the one or more passages 321 the inserts 35 pass through exposed in y-direction, while the wiring 4 passes through the passage 321 in x-direction and passes between two or more rods 35 as can be seen in FIG. 6. For this reason, the flexible carrier for the wiring 4 may also be bent to pass between the rods 35 or between a rod 35 and a wall defining the passage 321.

Figure 7:
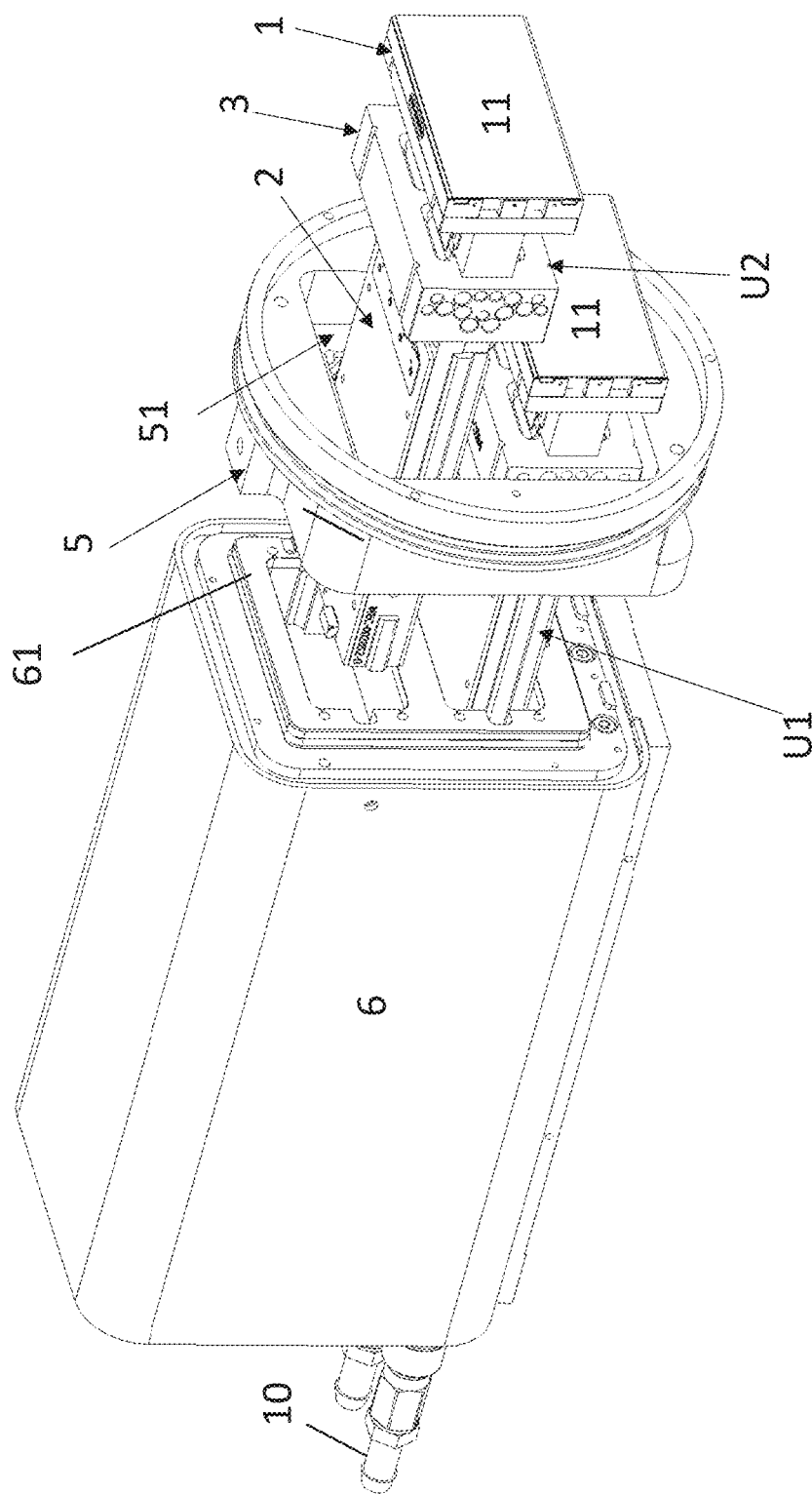

FIG. 7 illustrates a perspective exploded view of an electron detector according to an embodiment of the invention. The detector resembles the detector of FIG. 2, however, shown from a different perspective. The units U1 and U2 reach through an opening 51 in a sealing n plate 5. In this embodiment, the sealing plate 5 and the adaptor 3, and specifically its sealing portion including the rods, contribute to the vacuum seal to be established. On the other hand, the sensor modules 1 remain exposed from the sealing plate 5 for sensing purposes.

Figure 8:
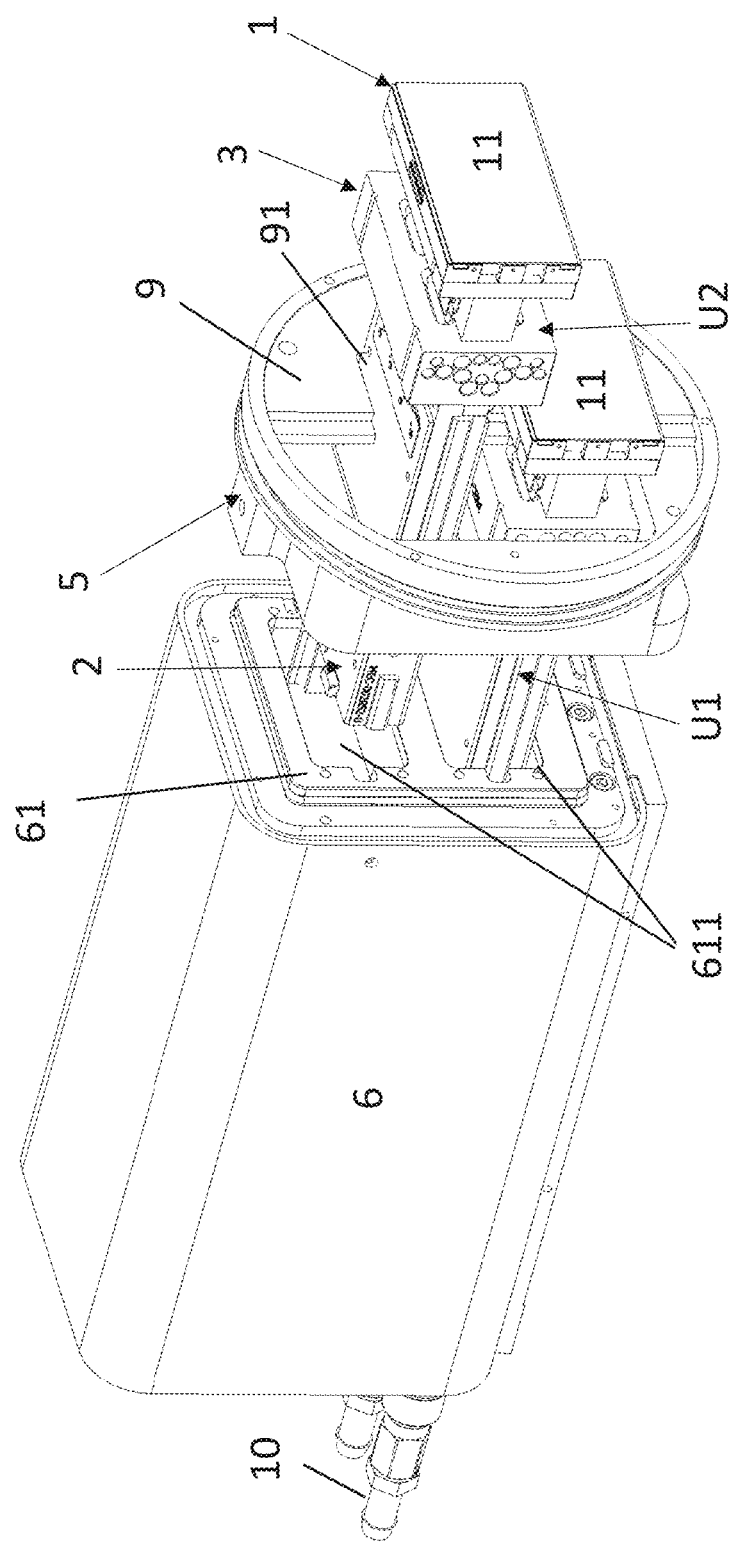

FIG. 8 illustrates a perspective view of an electron detector according to an embodiment of the invention. The detector differs from the detector of FIG. 7 in that additionally a shielding plate 9 is provided, which preferably is inserted into the sealing plate 5. The shielding plate 9 preferably is made from a material shielding x-ray radiation, such as tungsten. Only a half of the shielding plate 9 is shown while the second half is omitted for illustration purposes solely. The shielding plate 9 has an opening 91 through which the units U1 and U2 reach into the housing 6.

Figure 9:
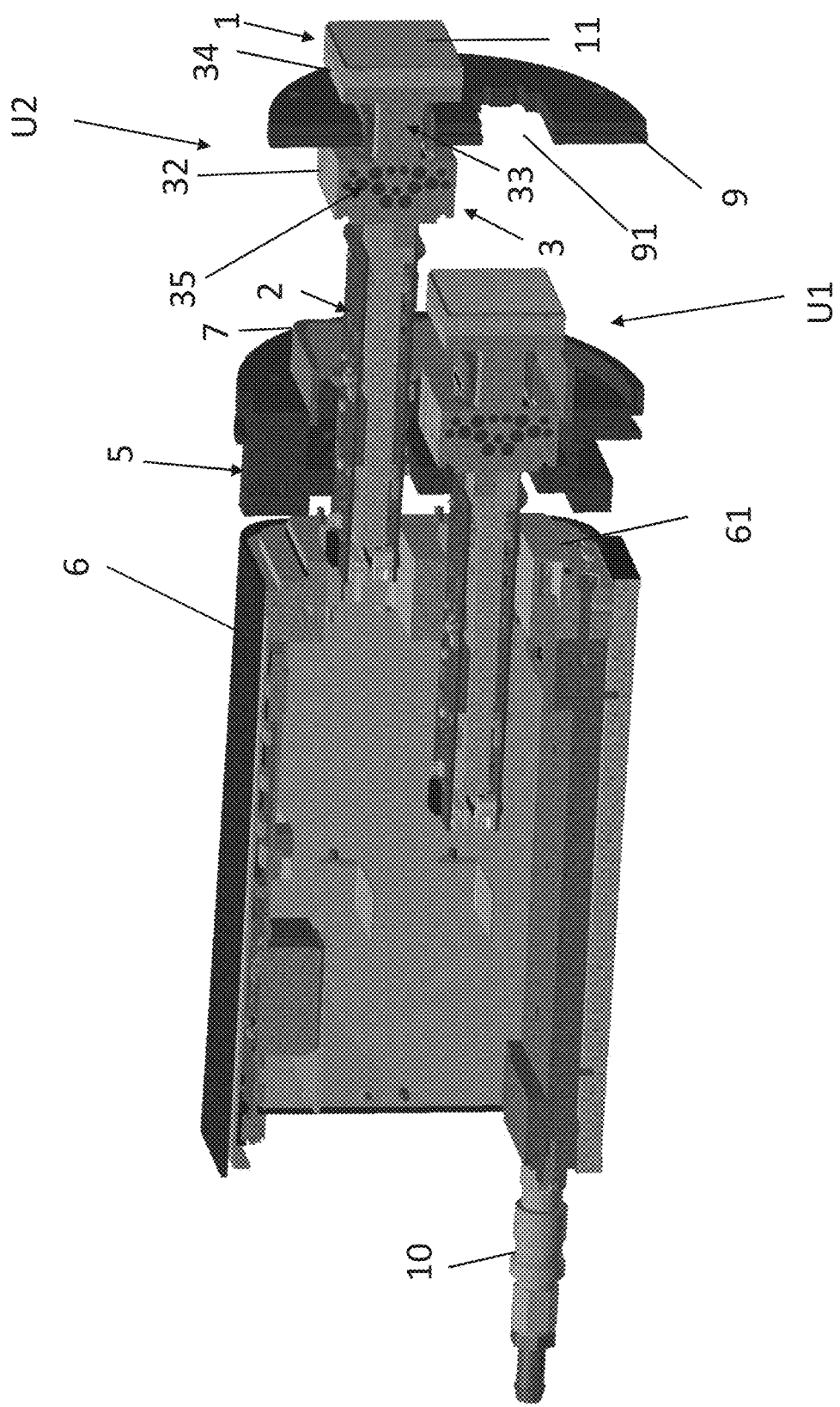

FIG. 9 shows an electron detector in a perspective exploded view, according to an embodiment of the invention. The electron detector of FIG. 9 differs from other embodiments in that in addition to shielding plate 9 a shield 7 is provided for shielding from primary or secondary radiation. The shield 7 and the shielding plate 9 are arranged in the sensor module domain, i.e. behind or in front of the sealing portion 32 of the adaptor 3, subject to perspective. The shield 7 is inserted in the sealing plate 5. The shielding plate 9 is mounted onto the sealing plate 5. Openings 91 in the shielding plate 9 provide for an exposure of the sensing modules 1.

In the present embodiment, the housing 6 again comprises a flange 61 at its front end for mounting the sealing plate 5 to. Presently, the flange 61 of the housing 6 includes two openings, one per unit U1, U2 to reach through. In a preassembling step, the shield 5 is inserted in the sealing plate 5, and the units U1 and U2 are mounted to the sealing plate 5. This assembly containing the sealing plate 5 is then mounted to the flange 61 of the housing 6. Finally, the shielding plate 9 is mounted to the sealing plate 5.

Figure 10:
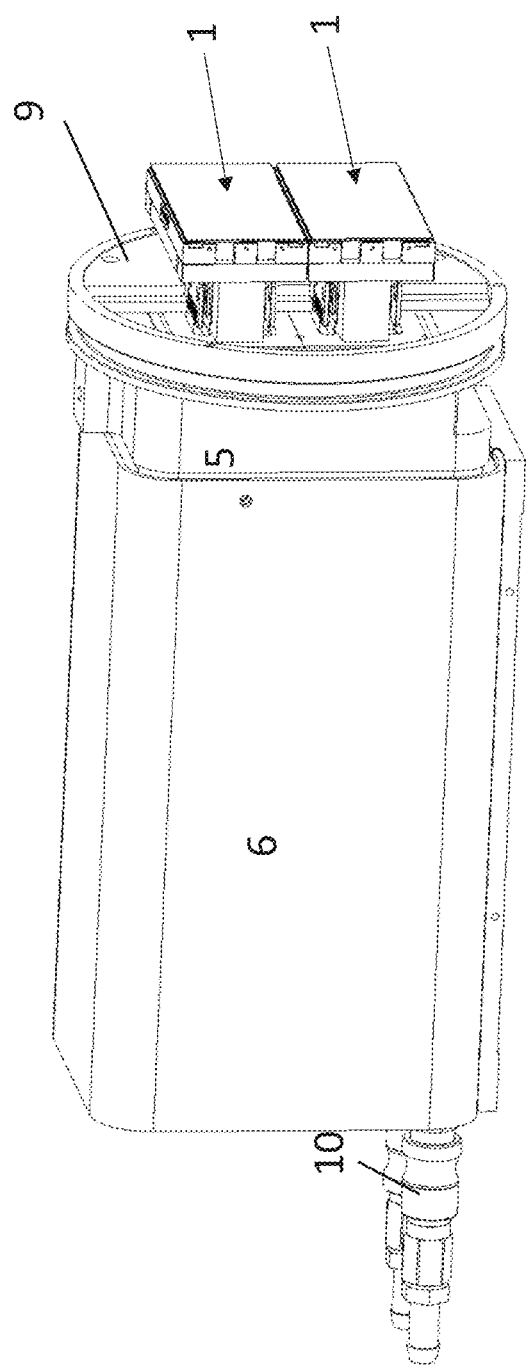

FIG. 10 illustrates the electron detector of FIG. 1 or FIG. 8 in a perspective side view.

Figure 11:
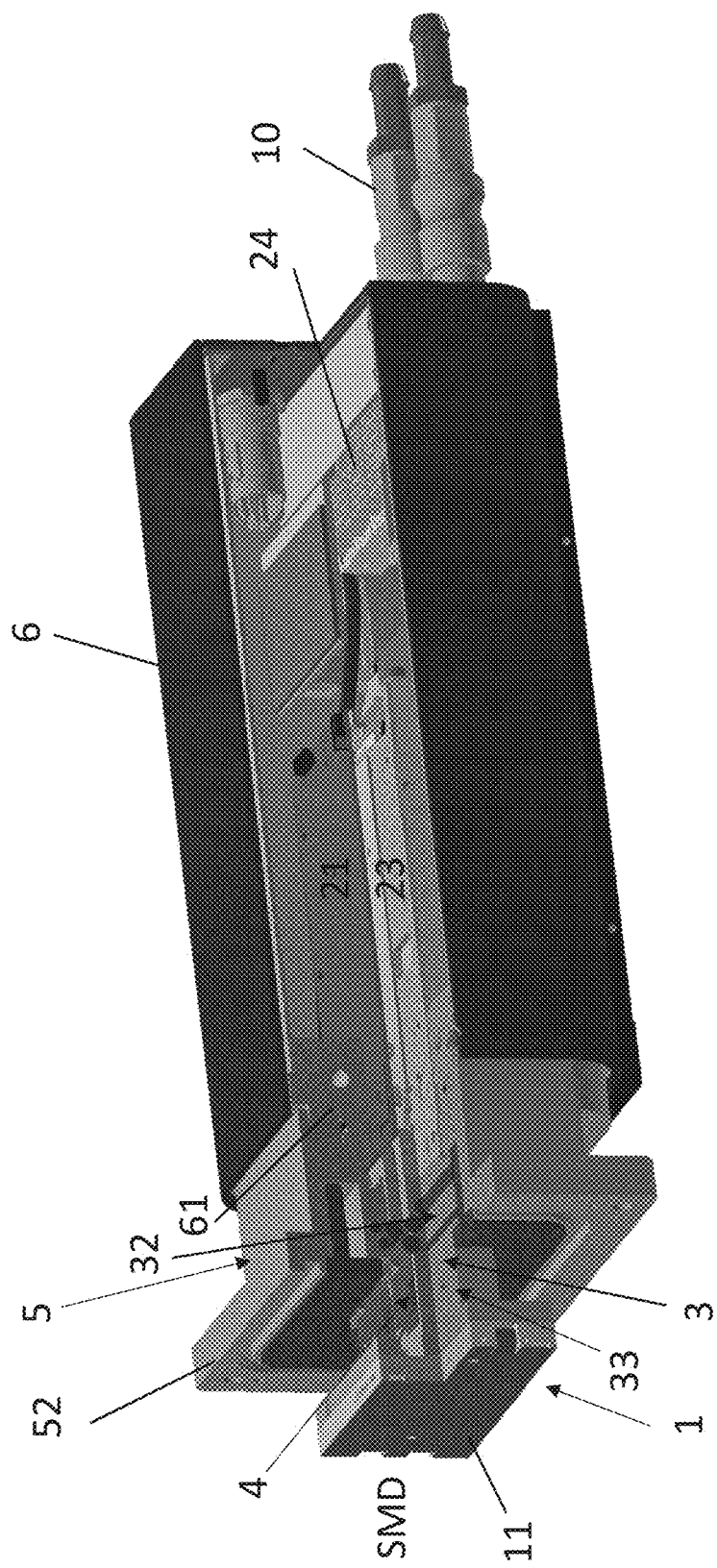

FIG. 11 shows a perspective open cut and exploded view of an electron detector according to an embodiment of the invention. The present detector only comprises one unit. The sealing plate 5 is mounted to a flange 61 of the housing 6. In addition, the sealing plate 5 shows a collar 52 surrounding the sensor module 1. One or more shielding plates may be mounted in the sensor module domain, however, none of these is shown in FIG. 11.

While there are shown and described presently preferred embodiments of the invention, it is to be distinctly understood that the invention is not limited thereto but may be otherwise variously embodied and practiced within the scope of the following claims.

In particular, for each embodiment, the number of units comprised in the respective detector may vary. Hence, each embodiment shall considered to be disclosed for any number of units mounted in a common housing. However, a preferred number of units for all embodiments is 1, 2, 8, 18 or 32.

The invention claimed is:

1. Electron detector, comprising
a sensor module comprising a sensor for detecting electrons,
an electronics module comprising circuitry electrically connected to the sensor module,
wiring for electrically connecting the sensor module to the electronics module,
an adaptor arranged between the sensor module and the electronics module, the adaptor comprising
a passage for the wiring,
radiation shielding elements.

2. The electron detector of claim 1,
the adaptor comprising a body and inserts in the body serving as the shielding elements for supporting shielding the electronics module from primary or secondary radiation,
the inserts comprising or consisting of an x-ray and electron absorbing material, in particular tungsten.

3. The electron detector of claim 2,
wherein at least one of the inserts extends into the passage.

4. The electron detector of claim 3,
wherein the wiring passes through the passage between two or more of the inserts or between one or more of the inserts and a wall of the body defining the passage,
wherein the wiring is supported by a flexible carrier.

5. The electron detector of claim 2,
wherein at least a majority of the inserts are formed as longitudinal rods,
wherein the rods are aligned in parallel to each other,
wherein the rods include a first number of rods with a first diameter, and preferably a second number of rods with other diameters smaller than the first diameter.

6. The electron detector of claim 1, comprising
a vacuum seal for sealing a domain of the sensor module from a domain of the electronics module,
wherein the adaptor is configured to contribute to the vacuum seal,
wherein the passage of the adaptor is sealed by a sealing compound.

7. The electron detector of claim 6,
wherein the vacuum seal comprises a sealing plate including an opening covered by the adaptor.

8. The electron detector of claim 6, comprising
a housing defining a non-vacuum domain,
wherein the electronics module is arranged in the housing,
wherein the vacuum seal, and preferably the sealing plate, is attached to the housing.

9. The electron detector of claim 2, comprising
a vacuum seal for sealing a domain of the sensor module from a domain of the electronics module,
wherein the vacuum seal comprises a sealing plate including an opening covered by the adaptor,
wherein the adaptor comprises a sealing portion covering the opening in the sealing plate,
wherein the inserts are arranged in the sealing portion of the adaptor in planes parallel to a plane of the opening in the sealing plate,
wherein the passage of the adapter is sealed by a sealing compound.

10. The electron detector of claim 1, comprising
a shielding plate contributing to shielding from radiation originating from a sensor module domain,
wherein the shielding plate comprises an opening for the adaptor to reach through, and preferably for the beam portion of the adaptor to reach through.

11. The electron detector of claim 1,
wherein the adaptor mechanically connects the sensor module and the electronics module,
wherein the adaptor supports the sensor module,
wherein the electronics module comprises a platform supporting the circuitry,
wherein the platform connects to the adaptor,
wherein a face of the sensor is arranged in a plane orthogonal to a longitudinal extension of the platform.

12. The electron detector of claim 11,
wherein the body of the adaptor includes a thermally conducting material, wherein the platform includes a thermally conducting material, wherein the platform is thermally connected to the body of the adaptor for acting as heat sink for heat transferred from the sensor module via the adaptor to the platform, wherein the sensor module comprises a thermally conducting support for the sensor, wherein the support is thermally connected to the adaptor.

13. The electron detector according to claim 8, comprising a number of sensor modules, a corresponding number of electronics modules, wiring/electrical conductors for electrically connecting each sensor module to the corresponding electronics module, a corresponding number of adaptors, each adaptor being arranged between one of the sensor modules and the corresponding electronics module, the electronics modules are arranged in the housing, preferably wherein the sealing plate comprises one opening per adaptor, wherein the shielding plate comprises one opening per adaptor.

14. An adaptor, comprising a first mechanical interface for connecting to a sensor module comprising a sensor for detecting electrons, a second mechanical interface for connecting to an electronics module comprising circuitry electrically connectable to the sensor module, shielding elements configured to shield from radiation originating from a domain defined by the first mechanical interface, a passage configured to allow wiring for electrically connecting the sensor module to the electronics module to pass the adaptor.

15. The electron detector of claim 3, wherein at least one of the inserts bridges the passage, wherein the passage is embodied in form of one or more channels in the adaptor.

16. The electron detector of claim 5, wherein the rods are arranged in multiple planes in parallel to each other in the body.

17. The electron detector of claim 6, wherein the sealing compound is an epoxy, wherein the sealing compound is arranged in the passage.

18. The electron detector of claim 6, wherein the sealing plate comprises a mechanical interface for mounting the adaptor, wherein the mechanical interface includes a seal ring between the adaptor and the sealing plate.

19. The electron detector of claim 9, wherein the inserts reach through the entire sealing portion in the respective plane, wherein the sealing portion has a cross section at least as big as the opening in the sealing plate and exceeding a cross section of an adjacent beam portion of the adaptor mechanically supporting the sensor module, wherein a bottom edge of the passage is arranged co-planar with a top level of the beam portion, and preferably is arranged co-planar with the top level of the circuitry.

20. The electron detector of claim 10, wherein the shielding plate comprises or consists of x-ray and electron absorbing material, in particular tungsten, wherein the shielding plate is arranged in the sensor module domain.

* * * * *